United States Patent
Iwamoto et al.

(10) Patent No.: US 10,631,403 B2
(45) Date of Patent: Apr. 21, 2020

(54) MICROCAPSULE, SHEET MATERIAL, CIRCUIT BOARD, METHOD FOR MANUFACTURING CIRCUIT BOARD, AND COMPUTER READABLE STORAGE MEDIUM

(71) Applicant: CASIO COMPUTER CO., LTD., Shibuya-ku, Tokyo (JP)

(72) Inventors: Kenji Iwamoto, Kokubunji (JP); Satoshi Kurosawa, Tokyo (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 0 days.

(21) Appl. No.: 16/508,364

(22) Filed: Jul. 11, 2019

(65) Prior Publication Data
US 2020/0037444 A1 Jan. 30, 2020

(30) Foreign Application Priority Data
Jul. 25, 2018 (JP) .................. 2018-139791

(51) Int. Cl.
| | |
|---|---|
| H05K 1/09 | (2006.01) |
| H05K 3/46 | (2006.01) |
| H05K 1/03 | (2006.01) |
| H05K 3/00 | (2006.01) |
| H05K 3/28 | (2006.01) |
| H05K 1/02 | (2006.01) |
| H05K 1/18 | (2006.01) |

(52) U.S. Cl.
CPC ......... *H05K 1/0393* (2013.01); *H05K 1/0201* (2013.01); *H05K 1/029* (2013.01); *H05K 1/0287* (2013.01); *H05K 1/189* (2013.01); *H05K 3/0005* (2013.01); *H05K 3/28* (2013.01); *H05K 3/4664* (2013.01); *H05K 2201/06* (2013.01); *H05K 2203/1105* (2013.01)

(58) Field of Classification Search
CPC .......... H05K 1/09; H05K 1/092; H05K 1/095; H05K 1/097; H05K 3/4664
See application file for complete search history.

(56) References Cited

U.S. PATENT DOCUMENTS
2012/0138868 A1 6/2012 Arifuku et al.

FOREIGN PATENT DOCUMENTS
| | | |
|---|---|---|
| JP | 06349339 A | 12/1994 |
| JP | 2000223795 A | 8/2000 |
| JP | 2001042763 A | 2/2001 |
| JP | 2001150812 A | 6/2001 |
| JP | 2010277997 A | 12/2010 |

*Primary Examiner* — Jeremy C Norris
(74) *Attorney, Agent, or Firm* — Holtz, Holtz & Volek PC

(57) ABSTRACT

A microcapsule includes a shell including a conducting component; and a thermally expandable component contained in the shell and having a property of expanding by heating, the shell deforming due to expansion of the thermally expandable component to come in contact with another capsule and have a conducting state with the other capsule.

23 Claims, 13 Drawing Sheets

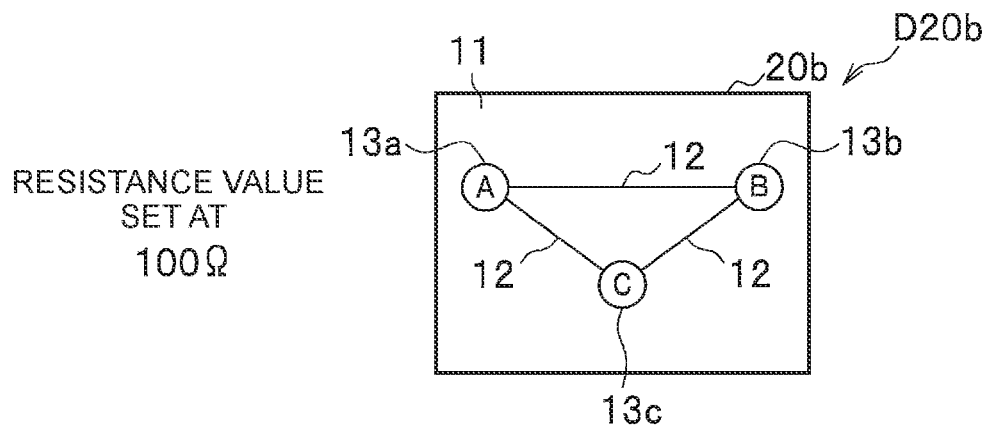
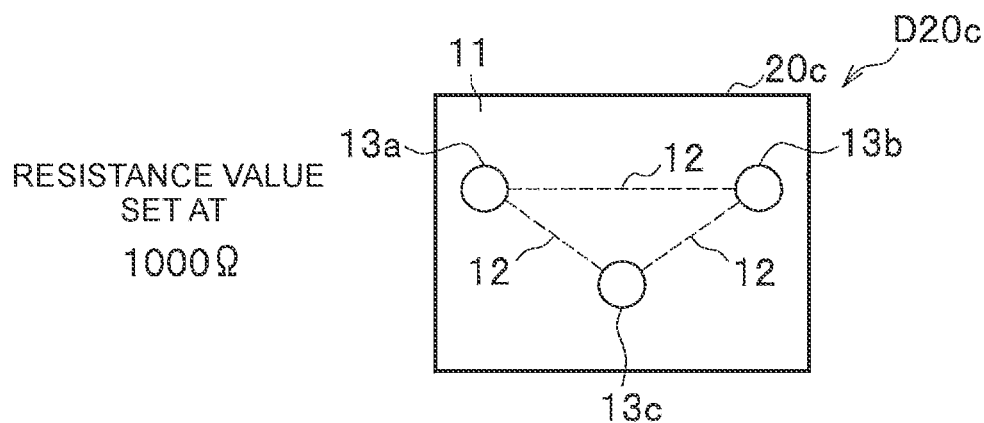
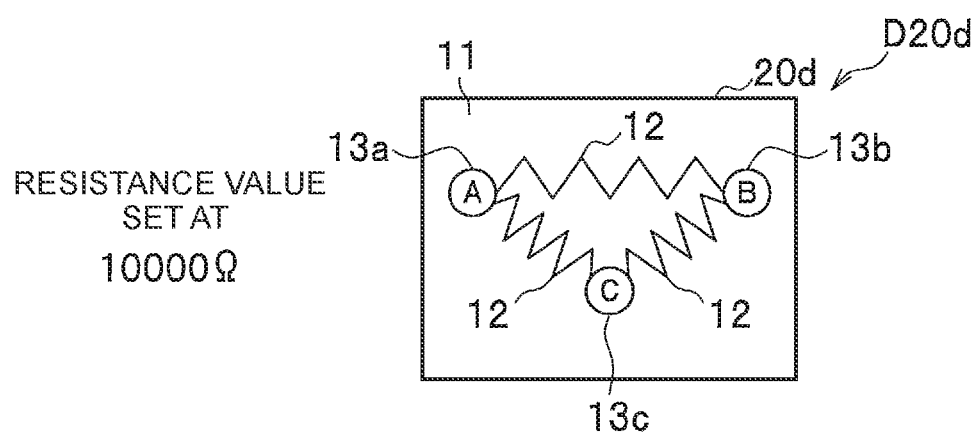

SET PROTECTIVE FILM

MICROCAPSULE, SHEET MATERIAL, CIRCUIT BOARD, METHOD FOR MANUFACTURING CIRCUIT BOARD, AND COMPUTER READABLE STORAGE MEDIUM

BACKGROUND

1. Field

The present invention relates to microcapsules, sheet materials, circuit boards, methods for manufacturing a circuit board, and computer readable storage media.

2. Related Art

According to a conventional method of creating a conductive circuit, e.g., a flexible wiring board described in JP 2000-223795 A, an operator at the field firstly creates an electronic circuit diagram (see FIG. 10A, for example) with a CAD (Computer-Aided Design) system. Next, the operator prepares a base material and fabricates a flexible wiring board (see FIG. 10B, for example) by machining the base material with a specialized machine. FIG. 10A shows one example of an electronic circuit diagram 100 created with a CAD system. FIG. 10B shows one example of a flexible wiring board 300.

To create a circuit with a universal board (see FIG. 10C, for example) described in JP 2001-42763 A, for example, an operator manually connects solder with the board. FIG. 10C shows an example of a universal board 400.

Such a field of creating a conductive circuit needs a circuit board having the wiring function equivalent to a flexible wiring board and a universal board, and that can be created easily in a short time and at low cost.

The afore-mentioned flexible wiring board described in JP 2000-223795 A, for example, is manufactured by creating an electronic circuit diagram with a CAD (Computer-Aided Design) system, and then preparing a base material and fabricating a flexible wiring board by machining the base material with a specialized machine. The creation of such a flexible wiring board therefore is limited to experts having an advanced knowledge of the field and requires certain time for creation. The creation of such a flexible wiring board also needs the cost, including the material cost and the facility cost. It is therefore difficult to prepare a plurality of types of flexible wiring boards. If the validation result of the created flexible wiring board shows an unfavorable operation, the operator is required to repeat the same job, which also needs a lot of cost and time for creation.

To create a circuit with the afore-mentioned universal board described in JP 2001-42763 A, for example, an operator manually connects solder with the board. Such creation of a circuit with a universal board therefore is a burden for the operator and requires certain time for preparation. If the validation result of the created circuit shows an unfavorable operation, the operator is required to create another circuit again, which also requires a lot of cost and time for creation.

The present invention aims to provide a circuit board having the wiring function equivalent to a flexible wiring board and a universal board, and that can be prepared easily in a short time and at low cost.

SUMMARY

A microcapsule includes a shell includes a conducting component; and a thermally expandable component contained in the shell and having a property of expanding by heating, the shell deforming due to expansion of the thermally expandable component to come in contact with another capsule and have a conducting state with the other capsule.

A thermally expandable material includes microcapsules and a binder having an insulating property, each microcapsule including a shell including a conducting component, and a thermally expandable component contained in the shell and having a property of expanding by heating, the shell deforming due to expansion of the thermally expandable component to come in contact with another capsule and have a conducting state with the other capsule.

A sheet material includes: a base layer; and a thermally expandable layer disposed on the base layer, the thermally expandable layer including microcapsules and a binder having an insulating property, each microcapsule including a shell including a conducting component, and a thermally expandable component contained in the shell and having a property of expanding by heating, the shell deforming due to expansion of the thermally expandable component to come in contact with another capsule and have continuity with the other capsule.

A circuit board includes: a base layer; and a thermally expandable layer disposed on the base layer, the thermally expandable layer having a not-expanding region and an expanding region, the not-expanding region defining an insulating region of a circuit, the expanding region defining a conducting region of the circuit, the thermally expandable layer including microcapsules and a binder having an insulating property, each microcapsule including a shell including a conducting component, and a thermally expandable component contained in the shell and having a property of expanding by heating, the shell at the expanding region deforming due to expansion of the thermally expandable component to come in contact with another capsule and have continuity with the other capsule.

A method for manufacturing a circuit board, includes: a first step of preparing a sheet material including a base layer and a thermally expandable layer disposed on the base layer; and a second step of expanding the sheet material partially so that a not-expanding region of the thermally expandable layer defines an insulating region of a circuit and an expanding region of the thermally expandable layer defines a conducting region of the circuit, the thermally expandable layer including microcapsules and a binder having an insulating property, each microcapsule including a shell including a conducting component, and a thermally expandable component contained in the shell and having a property of expanding by heating, the shell at the expanding region deforming due to expansion of the thermally expandable component to come in contact with another capsule and have continuity with the other capsule.

A computer readable storage medium having stored thereon a program that is executable by a computer, the program making the computer implement the following functions to control a device to create a conversion diagram: setting a resistance value of a resistance in an electronic circuit diagram data; forming an image of at least a part of wiring included in the electronic circuit diagram data with photothermal ink; and expanding a thermally expandable layer in a sheet material to make up a circuit board of an electronic circuit to be formed based on the electronic circuit diagram data due to heat from the photothermal ink.

BRIEF DESCRIPTION OF THE DRAWINGS

FIG. 6B is drawing (2) that shows a modified example of a conversion diagram.

FIG. 6C is drawing (3) that shows a modified example of a conversion diagram.

FIG. 6D is drawing (4) that shows a modified example of a conversion diagram.

DETAILED DESCRIPTION

The following describes an embodiment of the present invention (hereinafter called a present embodiment) in details, with reference to the drawings. The drawings are just schematic views to enable sufficient understanding of the present invention. The present invention therefore is not limited to the examples shown in these drawings. Like numbers indicate like components throughout the drawings, and their duplicated descriptions are omitted.

Embodiment

A circuit board 30 (see FIG. 8) of the present embodiment is created with a sheet material 40 (see FIG. 1A) described later. This sheet material 40 includes a thermally expandable layer 42 (see FIG. 1A) described later. When heated, this thermally expandable layer 42 partially expands to be a desired pattern. This expansion of the thermally expandable layer creates a circuit board 30 (see FIG. 8).

<Configuration of a Sheet Material to Create a Circuit Board>

Figure 1A:
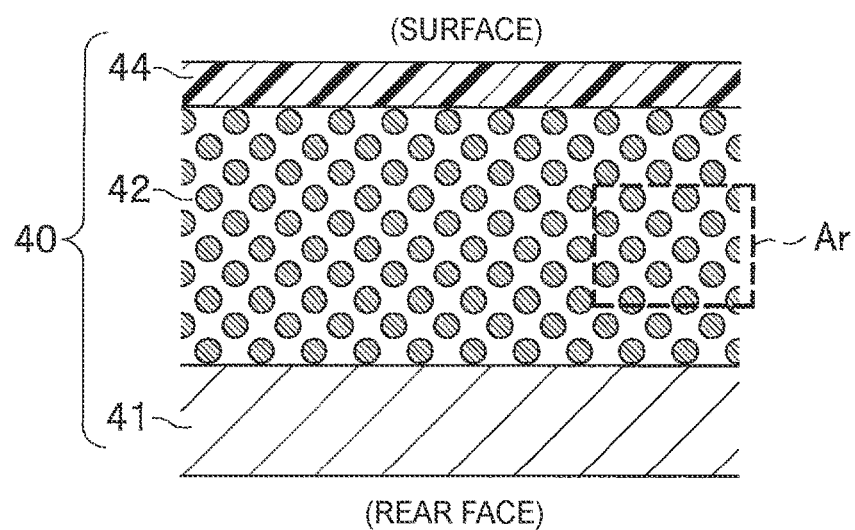
FIG. 1A shows the configuration of a sheet material according to one embodiment.
Figure 1B:
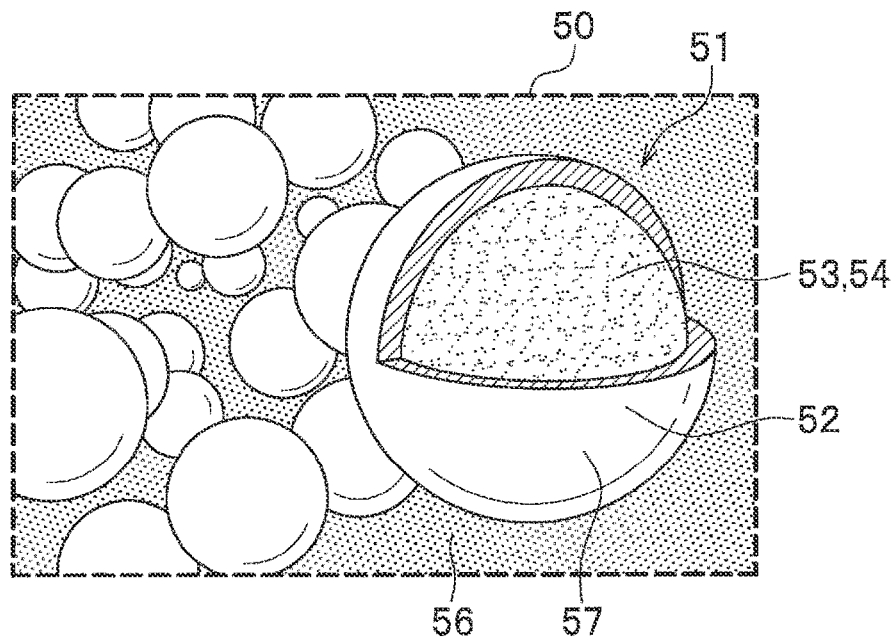
FIG. 1B shows the structure of a thermally expandable layer of a sheet material according to one embodiment.
Figure 1C:
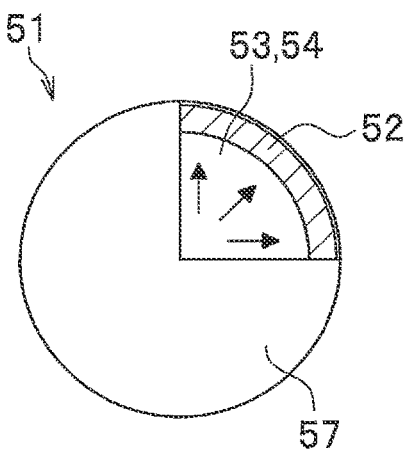
FIG. 1C schematically shows the configuration of a microcapsule according to one embodiment.
Figure 8:
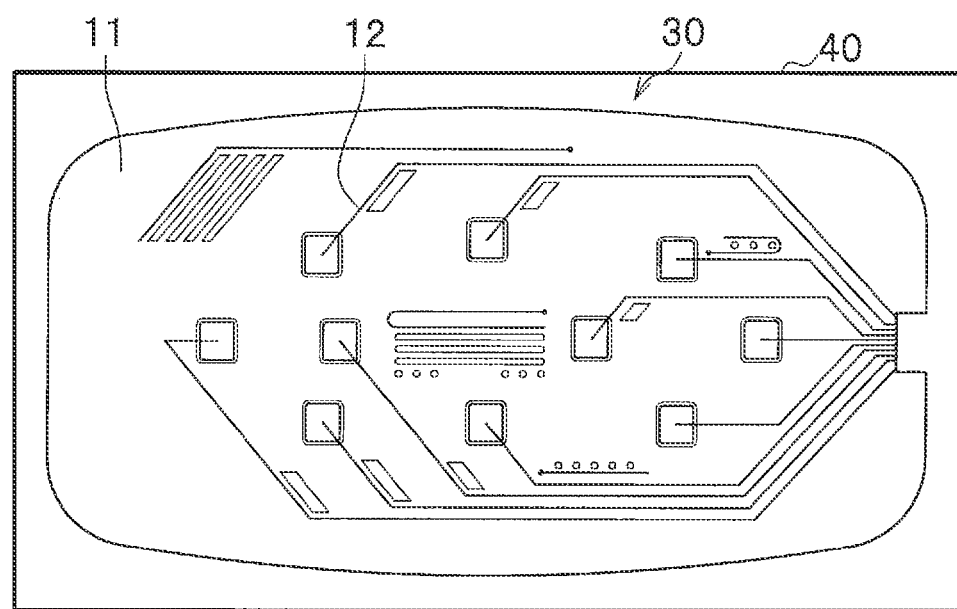
FIG. 8 shows one example of a circuit board created by the present embodiment.

Referring to FIG. 1A to FIG. 1C, the following describes the configuration of a sheet material 40 to create a circuit board 30 (see FIG. 8). FIG. 1A shows the configuration of the sheet material 40. FIG. 1B shows the configuration of a thermally expandable material used for the thermally expandable layer 42 (see FIG. 1A) of the sheet material 40. FIG. 1B is an enlarged view of region Ar of the thermally expandable layer 42 in FIG. 1A. FIG. 1C schematically shows the configuration of a microcapsule 51 included in the thermally expandable layer 42.

As shown in FIG. 1A, the sheet material 40 includes the thermally expandable layer 42 and a microfilm 44 on a base layer (base) 41.

The base layer (base) 41 includes paper or resin, such as PET (polyethylene terephthalate). The base layer 41 preferably has heat resistance. The base layer 41 preferably is flexible moderately.

The thermally expandable layer 42 expands by heating.

Figure 3A:
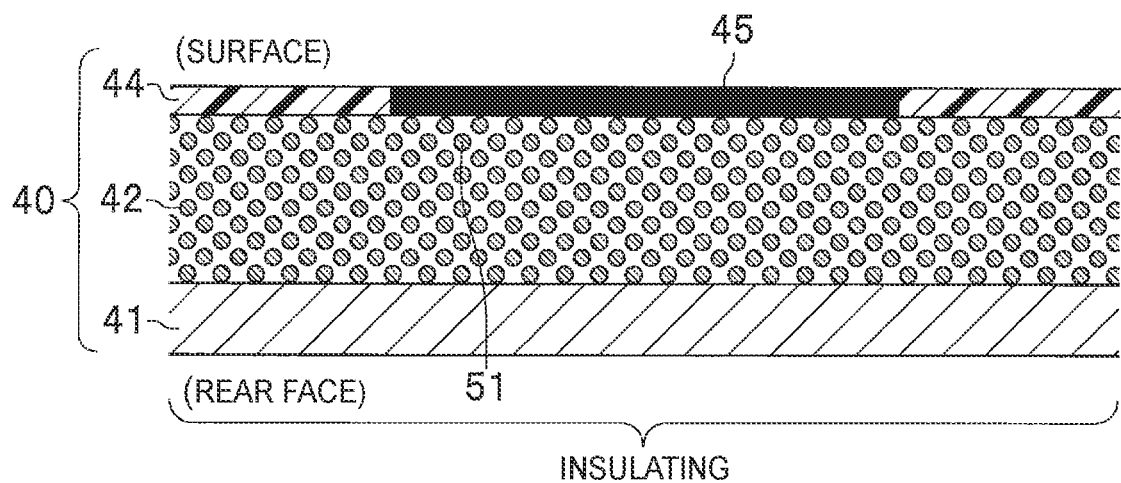
FIG. 3A is drawing (1) that shows a formation step of a circuit board.

The microfilm 44 is a layer to print (apply) photothermal ink 45 (see FIG. 3A).

As shown in FIG. 1B, the thermally expandable layer 42 includes thermally expandable ink 50 as a thermally expandable material. In one example, the thermally expandable layer 42 is formed by applying the thermally expandable ink 50 that is a thermally expandable material in the liquid form on the base layer 41, followed by drying.

The thermally expandable ink 50 (thermally expandable material) includes microcapsules 51 having a conducting property that are mixed in a binder 56 having an insulating property. Photothermal ink 45 is printed (applied) at a region of the microfilm 44 (see FIG. 3A) of the sheet material 40. When such a sheet material 40 is irradiated with light, the thermally expandable layer 42 at a part corresponding to the printed region expands.

The binder 56 includes emulsion of a resin material. Emulsion is a substance including a dispersion medium and dispersed material, both of which are in the liquid form.

Each microcapsule 51 includes a shell 52 and a core 53. The core 53 is a thermally expandable component contained in the shell 52. FIG. 1B shows the contained core 53 by cutting the shell 52 at an about quarter part on the front. In one example, the shell 52 includes acrylonitrile copolymer as thermoplastic resin. The shell 52 includes a metal filler 57 as a conductive component, and so has a conducting property. The core 53 contained in the shell 52 includes hydrocarbon 54, and has an insulating property. The hydrocarbon 54 has a thermally expandable property that expands by heating.

"Thermoplasticity" of a material as stated above refers to a property that the material is plastically deformed when it is heated under pressure. "Thermal expandable property" of a material as stated above refers to a property that the material expands when it is heated.

Preferably the hydrocarbon 54 is in the liquid form and has a relatively low boiling point (liquid low-boiling hydrocarbon). In one example, the hydrocarbon 54 includes the following components in the increasing order of the number of carbons.

Methane ($CH_4$), ethane ($C_2H_6$), propane ($C_3H_8$), butane ($C_4H_{10}$), pentane ($C_5H_{12}$), hexane ($C_6H_{14}$), heptane ($C_7H_{16}$), octane ($C_8H_{18}$), nonane ($C_9H_{20}$), and decane ($C_{10}H_{22}$).

The boiling point of the hydrocarbon 54 increases with the number of carbons. In one example, the above-mentioned components have the following boiling points.

The boiling points of methane, ethane, propane, butane, pentane, hexane, heptane, octane, nonane, and decane are −162° C., −89° C., −42° C., −1° C., 36.1° C., 68° C., 98.42° C., 125° C., 151° C., and 174.1° C., respectively.

In the present embodiment, the hydrocarbon 54 includes a single component or two or more types of components in combination of these components so that the hydrocarbon expands at a desired temperature (expansion temperature).

As shown in FIG. 1C, the core 53 of each microcapsule 51 expands by heating. FIG. 1C shows the microcapsule 51 having a part cut on the upper right to explain the cross-sectional structure of the shell 52 (the same applies to FIG. 2A to FIG. 2C). The shell 52 of the microcapsule 51 deforms so as to extend with the expansion of the core 53 (thermally expandable component). The shell 52 has a conducting property. When the shell 52 deforms due to the expansion of the core 53 (thermally expandable component), the shell 52 comes in contact with another capsule to form a conducting region between these capsules.

Figure 2A:
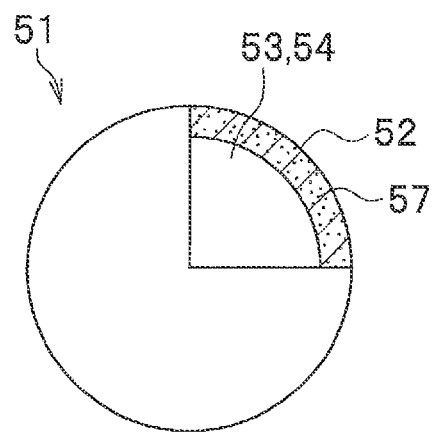
FIG. 2A is drawing (1) that shows a microcapsule according to one embodiment.
Figure 2B:
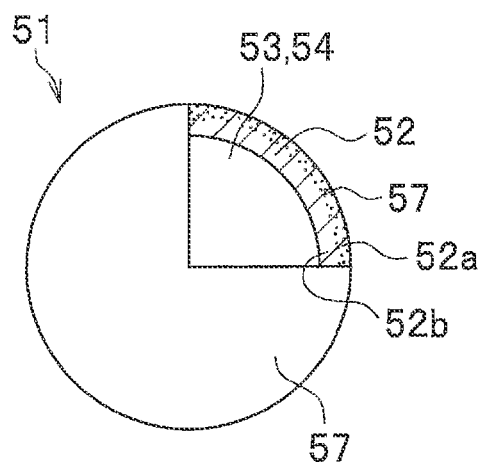
FIG. 2B is drawing (2) that shows a microcapsule according to one embodiment.
Figure 2C:
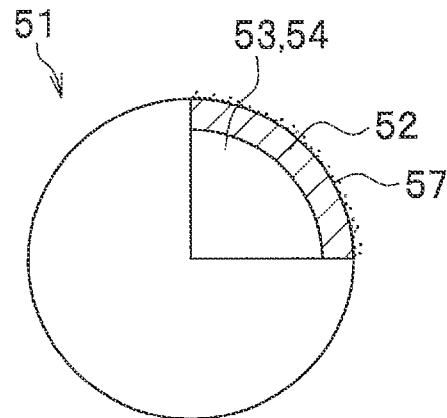
FIG. 2C is drawing (3) that shows a microcapsule according to one embodiment.

The microcapsule 51 includes a metal filler 57 as a conductive component in the shell 52 (see FIG. 2A to FIG. 2C). FIG. 2A to FIG. 2C show the configurations of the microcapsule 51. The microcapsule 51 has any one of the configurations shown in FIG. 2A to FIG. 2C.

In the example of FIG. 2A, the shell 52 of the microcapsule 51 includes a resin material having metal filler 57 mixed therein.

In the example of FIG. 2B, the shell 52 of the microcapsule 51 includes an outer layer 52a including a resin material having the metal filler 57 mixed therein, and an inner layer 52b including a resin material not having the metal filler 57 mixed therein.

In the example of FIG. 2C, the shell 52 of the microcapsule 51 includes a resin material coated with the metal filler 57 on the surface.

<Formation Step of Circuit Board>

Referring to FIG. 3A to FIG. 3D, the following describes formation steps of the circuit board 30. FIG. 3A to FIG. 3D show the formation steps of the circuit board 30, showing a change in the cross-sectional shape of the sheet material 40.

As shown in FIG. 3A, the overall region of the sheet material 40 is an insulating region. The operator sets such a sheet material 40 at a not-illustrated printer of an ink-jet scheme. The operator then prints (applies) photothermal ink 45 at a region of the microfilm 44 corresponding to the region of the thermally expandable layer 42 to be expanded with the not-illustrated printer. In the present embodiment, the "region of the thermally expandable layer 42 to be expanded" means a conducting region, such as wiring and connecting terminals, in the circuit board 30 (see FIG. 8). The photothermal ink 45 is black ink including carbon black. The photothermal ink 45 absorbs light and converts the absorbed light into heat.

Figure 3B:
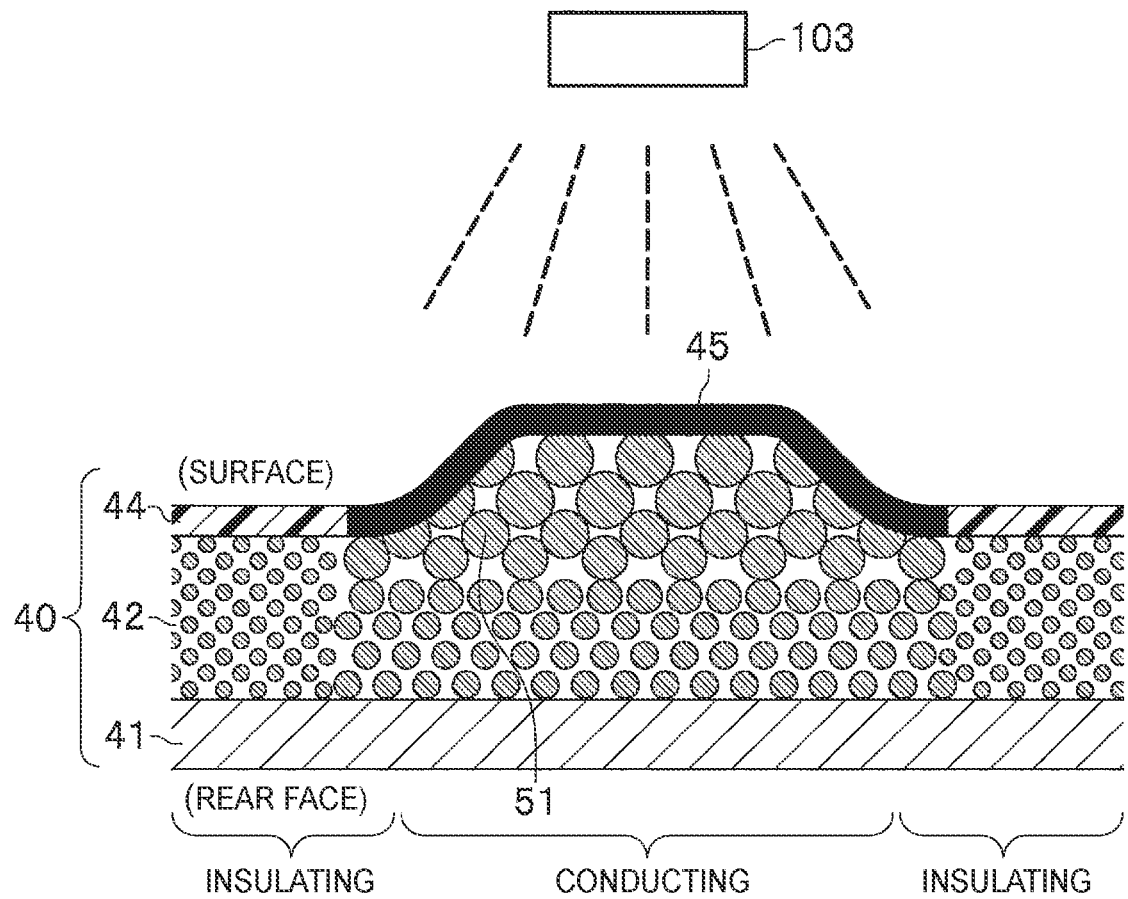
FIG. 3B is drawing (2) that shows a formation step of a circuit board.

Next as shown in FIG. 3B, the operator disposes the sheet material 40 with the printed photothermal ink 45 near a heater 103 (heat source), and applies light to the sheet material 40 from the heater 103.

In one example, the heater 103 (heat source) includes a halogen heater. When irradiated with light from the heater 103, the photothermal ink 45 of the sheet material 40 converts the light into heat. Then the thermally expandable layer 42 located under the printed region of the photothermal ink 45 reacts to the heat and partially expands. This forms an expanding region in the sheet material 40.

The expanding region of the sheet material 40 defines a conducting region, and a not-expanding region of the sheet material 40 defines an insulating region. The principle to change the layer structure in this way is described later referring to FIG. 4A to FIG. 4C.

Figure 3C:
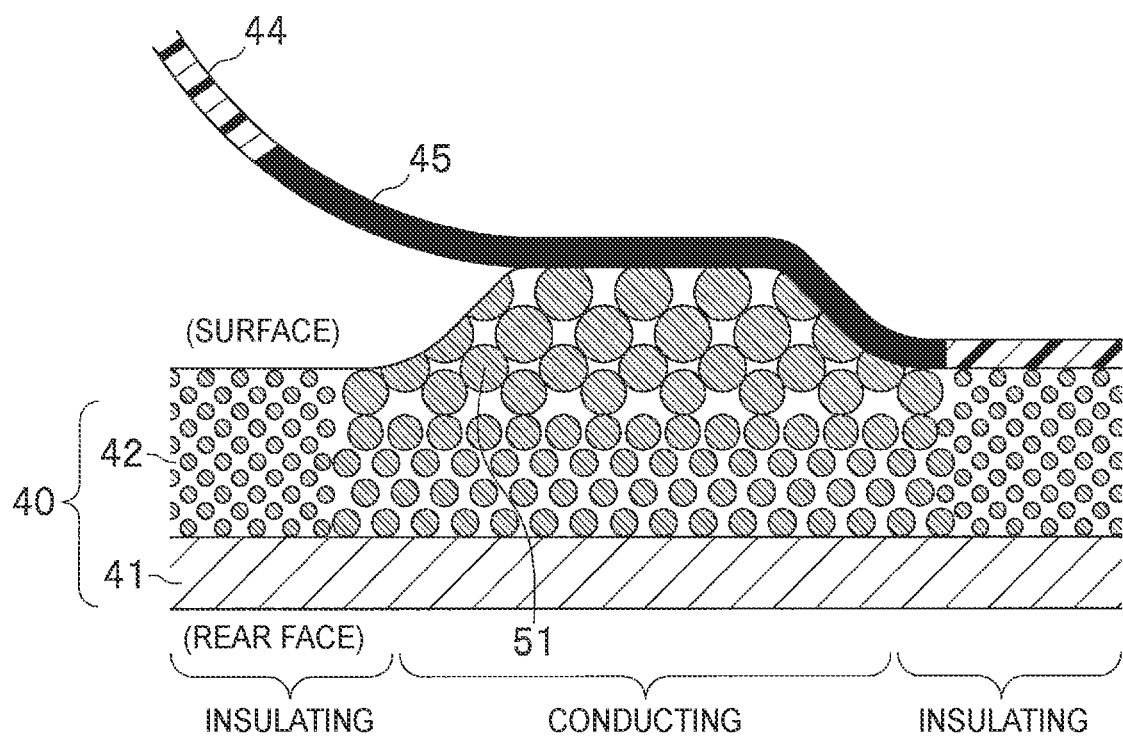
FIG. 3C is drawing (3) that shows a formation step of a circuit board.
Figure 3D:
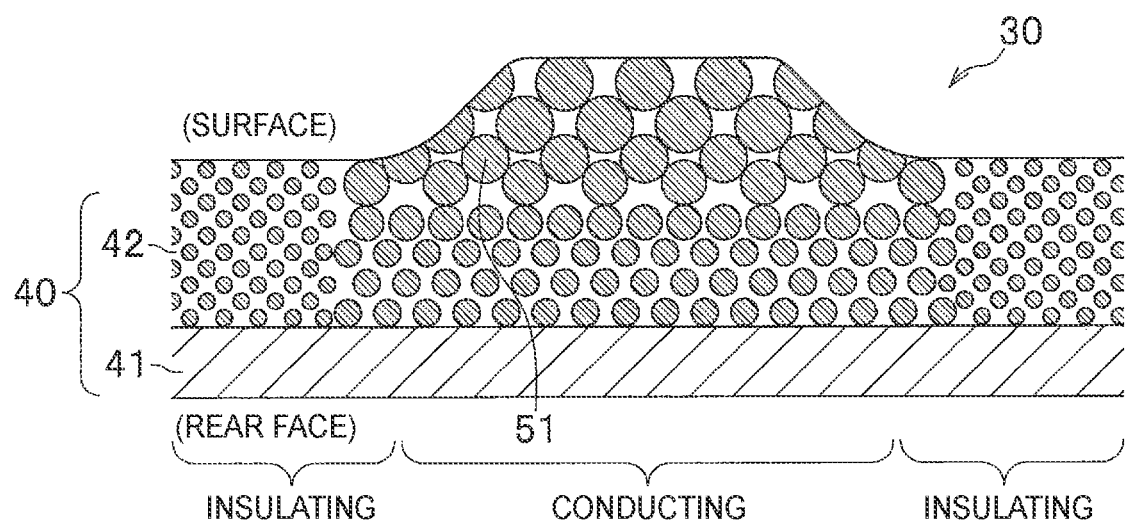
FIG. 3D is drawing (4) that shows a formation step of a circuit board.

Next as shown in FIG. 3C, the operator peels off the microfilm 44 from the thermally expandable layer 42 for removal. In this way the operator exposes the thermally expandable layer 42 as shown in FIG. 3D.

Using such a sheet material 40, the operator forms a circuit board 30 having a conductive circuit of any pattern.

<Principle to Change the Layer Structure>

Figure 4A:
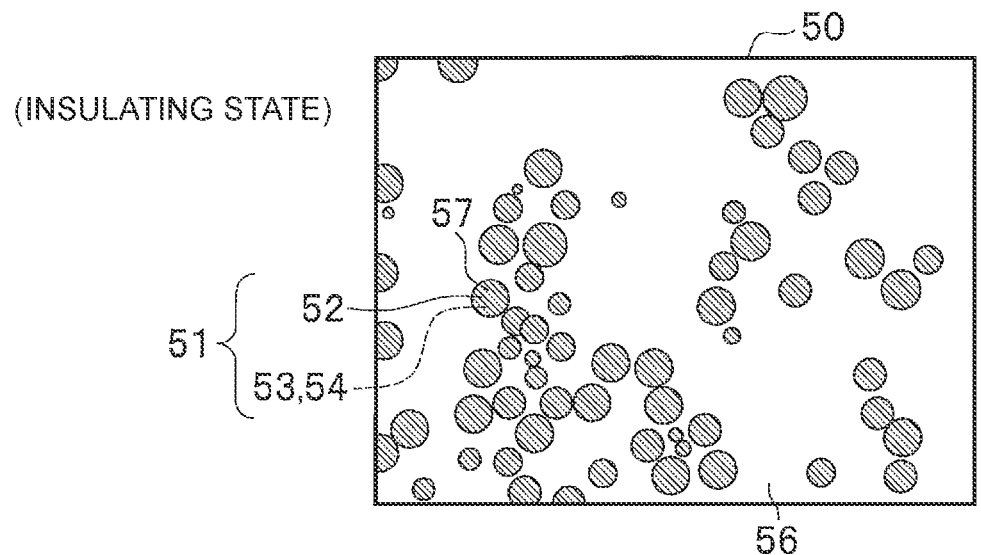
FIG. 4A shows a region of the thermally expandable layer to be expanded and shows the state before expansion.
Figure 4B:
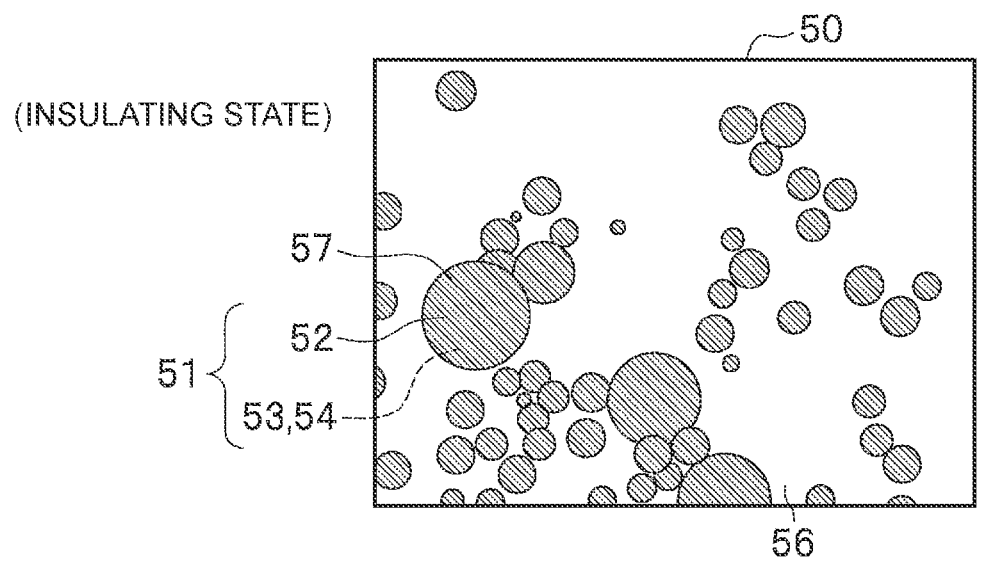
FIG. 4B shows the region of the thermally expandable layer to be expanded and shows the state during expansion.
Figure 4C:
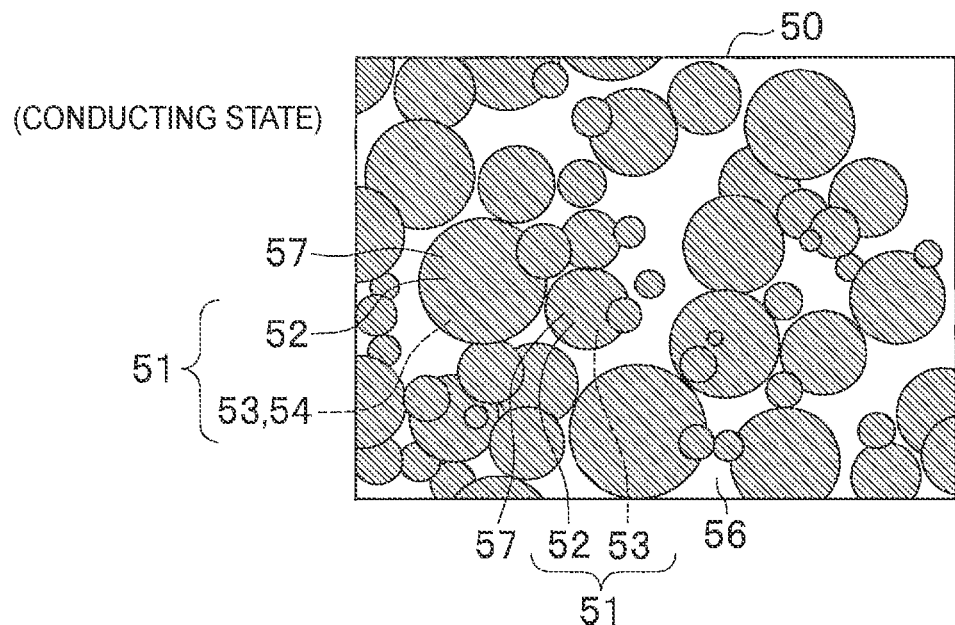
FIG. 4C shows the region of the thermally expandable layer to be expanded and shows the state after expansion.

The thermally expandable layer 42 of the sheet material 40 changes in the layer structure as shown in FIG. 4A, FIG. 4B and FIG. 4C, showing the state before expansion, during expansion, and after expansion, respectively. FIG. 4A shows a region of the thermally expandable layer 42 to be expanded and shows the state before expansion. FIG. 4B shows the region of the thermally expandable layer 42 to be expanded and shows the state during expansion. FIG. 4C shows the region of the thermally expandable layer 42 to be expanded and shows the state after expansion.

As shown in FIG. 4A, before expansion of the thermally expandable layer 42, none of the microcapsules 51 mixed in the thermally expandable layer 42 expand at the region of the thermally expandable layer 42 to be expanded. Most of the microcapsules 51 therefore are not in contact with other capsules at their shells 52. In this state, a sufficient amount of the insulating binder 56 is present around most of the microcapsules 51. This means that the region of the thermally expandable layer 42 to be expanded in this state defines an insulating region.

As shown in FIG. 4B, during expansion of the thermally expandable layer 42, a very limited part of the microcapsules 51 mixed in the thermally expandable layer 42 expands at the region of the thermally expandable layer 42 to be expanded. Although a part of the microcapsules 51 is in contact with other capsules at the shells 52, most of the microcapsules 51 still are not in contact with other capsules at their shells 52. In this state, a sufficient amount of the insulating binder 56 is still present around most of the microcapsules 51. This means that the region of the thermally expandable layer 42 to be expanded in this state still defines an insulating region.

As shown in FIG. 4C, after expansion of the thermally expandable layer 42, a part (or all) of the microcapsules 51 mixed in the thermally expandable layer 42 expands at the region of the thermally expandable layer 42 to be expanded. Most of the microcapsules 51 therefore are in contact with other capsules at their shells 52. In this state, only a small amount of the insulating binder 56 is present around the microcapsules 51. The conducting shells 52 are in contact with other capsules and so have continuity with the other capsules. This means that the expanding region of the thermally expandable layer 42 defines a conducting region. Preferably the expanding region of the thermally expandable layer 42 has elasticity.

<Creation of a Conversion Diagram>

The operator to create the circuit diagram 30 (see FIG. 8) prepares an electronic circuit diagram data D10 (see FIG. 5B) for an electronic circuit diagram 10 (see FIG. 5B) designed beforehand, for example. The operator may design an electronic circuit diagram 10 of various patterns (see FIG.

Figure 5A:
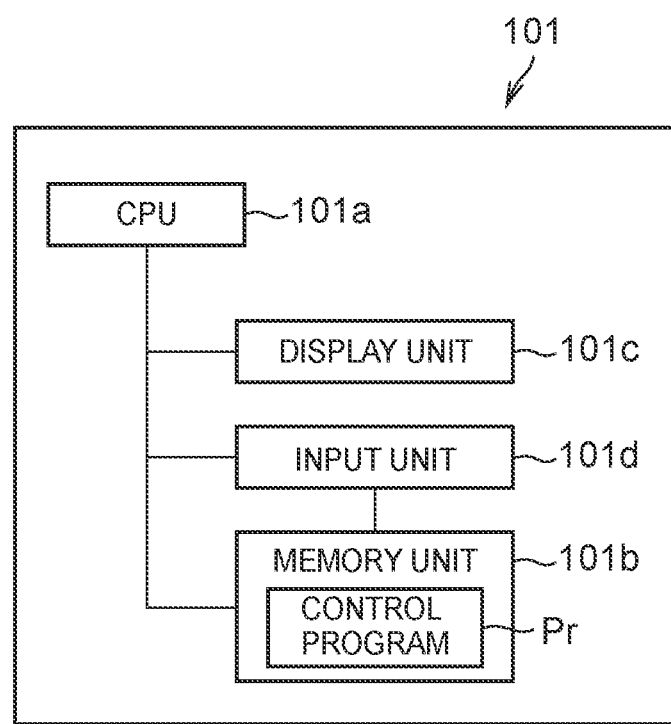
FIG. 5A shows one example of a conversion-diagram creation device.

5B) depending on the operations. To create the circuit board 30 (see FIG. 8), the operator uses a computer 101 of FIG. 5A, for example, that functions as a conversion-diagram creation device. The computer 101 creates a conversion diagram 20 (see FIG. 6A to FIG. 6E) corresponding to the electronic circuit diagram 10 (see FIG. 5B). The conversion diagram 20 shows an image to be formed with the photothermal ink 45. FIG. 5A shows one example of the conversion-diagram creation device.

The computer 101 as the conversion-diagram creation device includes a CPU 101$a$, a memory unit 101$b$, a display unit 101$c$, and an input unit 101$d$. The memory unit 101$b$ has a control program Pr installed beforehand to create the conversion diagram 20 from the electronic circuit diagram 10. The computer 101 creates the conversion diagram 20 from the electronic circuit diagram 10 in accordance with the control program Pr.

Figure 5B:
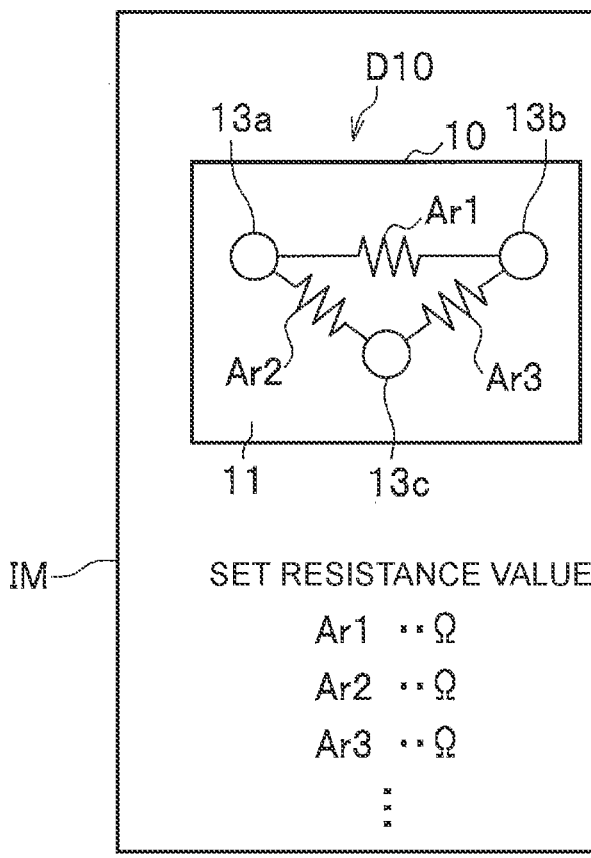
FIG. 5B shows an example of an input screen.

As shown in FIG. 5B, for example, the operator selects resistance Ar1, Ar2, or Ar3 of the electronic circuit diagram 10 on the input screen IM displayed at the display unit 101$c$ and sets a resistance value for the selected resistance. In this way, the operator forms a resistance circuit of a pattern in accordance with the resistance values of resistances Ar1, Ar2 and Ar3. FIG. 5B shows one example of the input screen IM. In the example of FIG. 5B, the electronic circuit diagram 10 of the electronic circuit diagram data D10 shows a circuit 11 including resistances Ar1, Ar2 and Ar3 disposed between three connecting terminals 13$a$, 13$b$, and 13$c$.

Each resistance may have a predetermined resistance value by adjusting the line width (thickness/area), the density, and the length of an image of resistance wirings 12 formed with the photothermal ink 45 (see FIG. 3A). The operator is allowed to replace any component with another component, delete any component or dispose a new component.

Figure 6A:
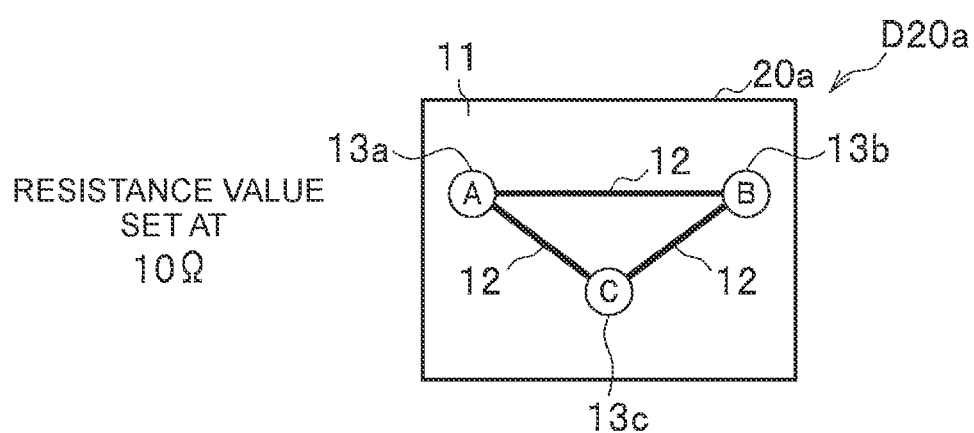
FIG. 6A is drawing (1) that shows a modified example of a conversion diagram.
Figure 6E:
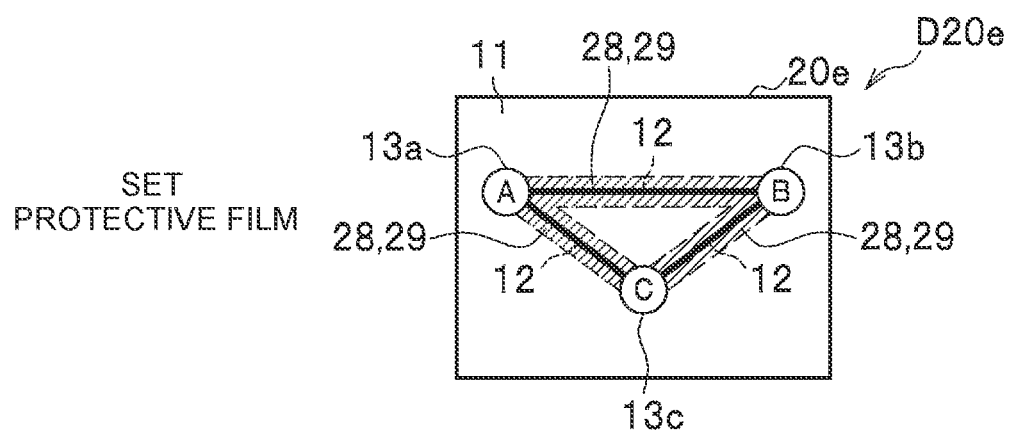
FIG. 6E is drawing (5) that shows a modified example of a conversion diagram.

Referring to FIG. 6A to FIG. 6E, the following describes a conversion example of the conversion diagram 20. FIG. 6A to FIG. 6E each show an example of conversion of the conversion diagram 20. FIG. 6A to FIG. 6D each show the shape of the resistance wiring 12 formed with the photothermal ink 45 (see FIG. 3A). FIG. 6E shows the shape of the resistance wiring 12 formed with the photothermal ink 45 (see FIG. 3A) as well as the shape of a protective film 29 on the resistance wiring 12. The protective film 29 is formed with color ink 28 (insulating ink) having an insulating property.

Assume the case where the operator sets a resistance value of the resistances Ar1, Ar2 and Ar3 of the electronic circuit diagram 10 at 10Ω on the input screen IM (see FIG. 5B). As shown in FIG. 6A, the computer 101 then automatically creates conversion diagram data D20$a$ of the conversion diagram 20$a$ corresponding to the configuration of the electronic circuit diagram data D10 (see FIG. 5B) in accordance with the electronic circuit diagram data D10. In the example of FIG. 6A, the conversion diagram 20$a$ of the conversion diagram data D20$a$ includes the resistance wirings 12 that have relatively large line widths (thickness/area) so as to correspond to the resistance value 10Ω of the resistances Ar1, Ar2 and Ar3.

Assume the case where the operator sets a resistance value of the resistances Ar1, Ar2 and Ar3 of the electronic circuit diagram 10 at 100Ω on the input screen IM (see FIG. 5B). As shown in FIG. 6B, the computer 101 then automatically creates conversion diagram data D20$b$ of the conversion diagram 20$b$ corresponding to the configuration of the electronic circuit diagram data D10 (see FIG. 5B) in accordance with the electronic circuit diagram data D10. In the example of FIG. 6B, the conversion diagram 20$b$ of the conversion diagram data D20$b$ includes the resistance wirings 12 that have line widths (thickness) smaller than those of the conversion diagram data D20$a$ (see FIG. 6A) so as to correspond to the resistance value 100Ω of the resistances Ar1, Ar2 and Ar3.

Assume the case where the operator sets a resistance value of the resistances Ar1, Ar2 and Ar3 of the electronic circuit diagram 10 at 1000 Ω on the input screen IM (see FIG. 5B). As shown in FIG. 6C, the computer 101 then automatically creates conversion diagram data D20$c$ of the conversion diagram 20$c$ corresponding to the configuration of the electronic circuit diagram data D10 (see FIG. 5B) in accordance with the electronic circuit diagram data D10. In the example of FIG. 6C, the conversion diagram 20$c$ of the conversion diagram data D20$c$ includes the resistance wirings 12 that have line widths (thickness) and heights (density) that are smaller than those of the conversion diagram data D20$b$ (see FIG. 6B) so as to correspond to the resistance value 1000Ω of the resistances Ar1, Ar2 and Ar3. A smaller height (smaller density) of an image of the resistance wiring 12 formed with the photothermal ink 45 (see FIG. 3A) means a smaller height of the expansion of the thermally expandable layer 42.

Assume the case where the operator sets a resistance value of the resistances Ar1, Ar2 and Ar3 of the electronic circuit diagram 10 at 10000 Ω on the input screen IM (see FIG. 5B). As shown in FIG. 6D, the computer 101 then automatically creates conversion diagram data D20$d$ of the conversion diagram 20$d$ corresponding to the configuration of the electronic circuit diagram data D10 (see FIG. 5B) in accordance with the electronic circuit diagram data D10. In the example of FIG. 6D, the conversion diagram 20$d$ of the conversion diagram data D20$d$ includes the resistance wirings 12 that are longer than those of the conversion diagram data D20$b$ (see FIG. 6B) so as to correspond to the resistance value 10000Ω of the resistances Ar1, Ar2 and Ar3. The conversion diagram data D20$d$ includes long resistance wirings 12 so as to increase the resistance value of the resistance wirings 12.

In the examples shown in FIG. 6A to FIG. 6D, the circuit 11 includes the resistance wirings 12 as conductors that are exposed. Preferably the circuit 11 is configured to avoid short-circuit at the resistance wirings 12 with metal, for example, that is placed on the resistance wirings 12. In one example as shown in FIG. 6E, the circuit 11 preferably includes a protective film 29 on the resistance wirings 12, and the protective film 29 is formed with color ink 28 (insulating ink) having an insulating property. In one example, the operator designates a desired region of the electronic circuit diagram 10 as the region to form the protective film 29 on the input screen IM (see FIG. 5B). As shown in FIG. 6E, the computer 101 then automatically determines the region to form the protective film 29 and creates a conversion diagram 20$e$ including such a region in accordance with the electronic circuit diagram data D10 (see FIG. 5B), and creates conversion diagram data D20$e$ indicating the conversion diagram 20$e$. In one example, the protective film 29 is formed by overlaying the color ink 28 printed with a not-illustrated printer. The protective film 29 functions as an insulating layer so as to avoid short-circuit with metal, for example, that is placed on the resistance wirings 12. The example in FIG. 6E shows the conversion diagram 20$e$ including the protective film 29 formed over the entire region of the resistance wirings 12. In another example, the computer 101 may create a conversion diagram 20e including the protective film 29 formed over only a part of the resistance wirings 12.

<Creation of Circuit Board>

Figure 7A:
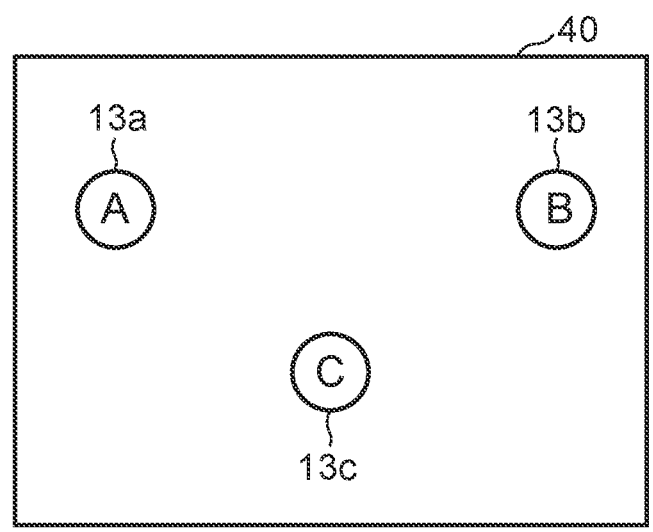
FIG. 7A is drawing (1) that shows a creation example of a circuit board.
Figure 7B:
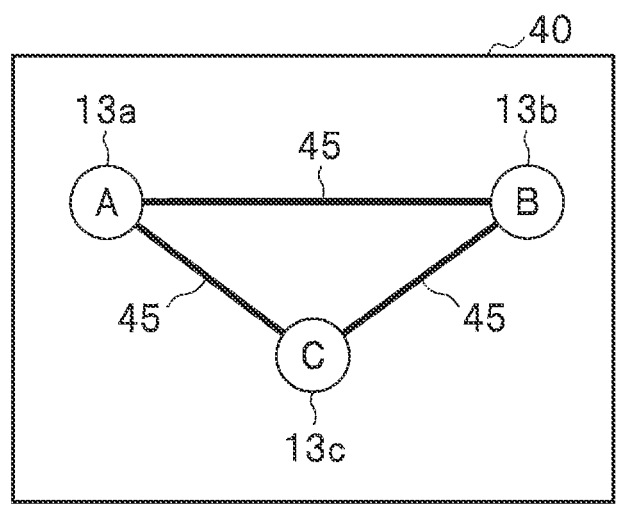
FIG. 7B is drawing (2) that shows a creation example of a circuit board.
Figure 7C:
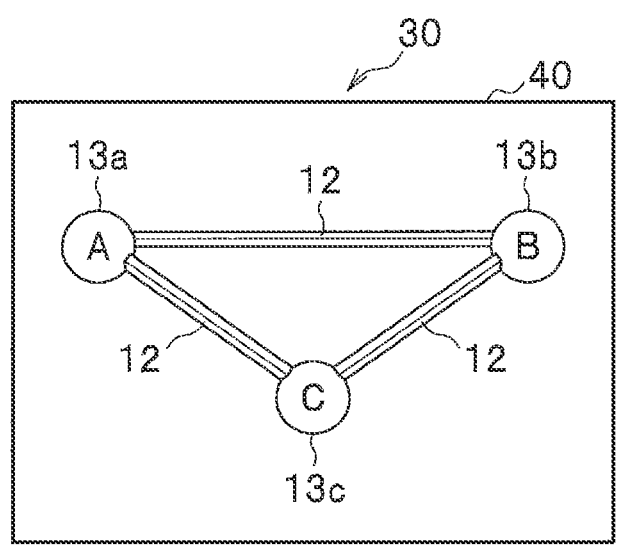
FIG. 7C is drawing (3) that shows a creation example of a circuit board.

Referring to FIG. 7A to FIG. 7C, the following describes creation of the circuit board 30. FIG. 7A to FIG. 7C show examples of the circuit board 30.

The example shown in FIG. 7A includes three connecting terminals 13a, 13b, and 13c on the surface of the sheet material 40.

The operator sets a sheet material 40 at a not-illustrated printer. The operator then prints (applies) photothermal ink 45 at a region corresponding to the region of the thermally expandable layer 42 to be expanded (see FIG. 3A) with the not-illustrated printer as shown in FIG. 7B.

Next the operator disposes the sheet material 40 near a heater 103 (see FIG. 3B), and applies light to the sheet material 40 from the heater 103 (see FIG. 3B). The photothermal ink 45 of the sheet material 40 converts the applied light into heat. This generates heat at the printed part (see FIG. 7B) of the photothermal ink 45. As a result, the thermally expandable layer 42 (see FIG. 3B) of the sheet material 40 partially expands to define three-dimensional resistance wirings 12 on the sheet material 40 as shown in FIG. 7C. After that, the operator peels off the microfilm 44 from the thermally expandable layer 42 (see FIG. 3C) to expose the thermally expandable layer 42 (see FIG. 3D). This creates the circuit board 30.

Such a circuit board 30 includes a desired region, including the resistance wirings 12 and connecting terminals not illustrated, that are expanded to form conducting regions, so as to configure an operating circuit. The circuit board 30 has a wiring function equivalent to a flexible wiring board and a universal board, for example.

The operator uses such a sheet material 40 having a circuit 11 formed thereon as the circuit board 30. The operator may separate any part from the sheet material 40 to create a various shaped circuit board 30. In the example shown in FIG. 8, a circuit 11 is formed on the sheet material 40. FIG. 8 shows one example of the circuit board 30 created by the present embodiment. The operator separates a part of the circuit 11 from the sheet material 40 shown in FIG. 8 to create a circuit board 30.

<Major Features of Sheet Material and Circuit Board>

The sheet material 40 of the present embodiment includes the base layer 41, and the thermally expandable layer 42 formed on the base layer 41. The thermally expandable layer 42 includes the microcapsules 51 and the binder 56 having an insulating property. Each microcapsule 51 includes a shell 52 containing a conducting component (metal filler 57), and a thermally expandable component (core 53) contained in the shell 52 and having a property of expanding by heating. The shell 52 deforms due to the expansion of the thermally expandable component (core 53) and so comes in contact with another capsule to have continuity with the other capsule.

The circuit board 30 of the present embodiment is formed by partially expansion of such a sheet material 40. In the circuit board 30 of the present embodiment, a not-expanding region of the thermally expandable layer 42 defines an insulating region of the circuit 11. The expanding region of the thermally expandable layer 42 defines a conducting region of the circuit 11. Such a circuit board 30 has a wiring function equivalent to a flexible wiring board and a universal board.

The circuit board 30 is created simply by printing a desired pattern corresponding to the conversion diagram 20 on the sheet material 40 with the photothermal ink 45, and partially expanding the sheet material 40. Such a circuit board 30 is manufactured using low-cost materials, and so is manufactured at low cost. Such a circuit board 30 is created easily in short time.

Such a circuit board 30 is created by facility that is a general-purpose device (e.g., the computer 101 (see FIG. 5A), a printer (not illustrated), and the heater 103 (see FIG. 3B)) and is not a specialized device. The manufacturing cost of a circuit board 30 therefore reduces.

Such a circuit board 30 is created without jobs, such as soldering. The circuit board 30 can reduce burden on the operator to create the circuit board. A large amount of such a circuit board 30 is manufactured in short time.

Since the circuit board 30 is at low cost, the operator may create a plurality of types of circuit board 30 in small amounts, for example. The operator therefore may create a plurality of types of circuit boards 30 as prototypes of a circuit used for the product being developed, for example, and may conduct various tests with these created circuit boards 30.

The circuit board 30 may have a different resistance value in accordance with the expansion height of the expanding region of the thermally expandable layer 42. In other words, the operator may know a change in the resistance value of the circuit board 30 in accordance with the expansion height of the expansion region. For instance, when the operator touches the expanding region of such a circuit board 30 with their hand, then the operator may know a change in the resistance value from the tactile sensing with the hand. In other words, the circuit board 30 allows the operator to know a change in the resistance value based on the tactile sensing with the hand in addition to the visual sense.

After the circuit 11 is formed on the circuit board 30, the photothermal ink 45 may be printed and be partially expanded again. This changes the original circuit 11 to another circuit or changes the original circuit 11 so as to hide the configuration of the circuit (i.e., to embed the original circuit 11 for deletion in the new expanding region). This allows the operator to conduct various tests of the created circuit 11 on the circuit board 30 before factory shipment, to change the original circuit 11 to another circuit, or to change the original circuit 11 so as to hide the configuration of the original circuit 11 for the factory shipment, for example. Such a circuit board 30 improves the confidentiality of the circuit 11.

The circuit board 30 has a high level of safety because it mainly include paper or resin, such as PET. The circuit board 30 therefore may be used for teaching materials of science, teaching materials in science classes, and materials for handicraft for kids, for example.

As stated above, the sheet material 40 of the present embodiment provides a circuit board 30 having the wiring function equivalent to a flexible wiring board and a universal board, and that can be prepared easily in a short time and at low cost.

The present invention is not limited to the above embodiment, and may be changed or modified variously without departing from the scope of the invention.

For instance, the embodiment as stated above shows the details for illustrative purpose of the gist of the present invention. The present invention therefore is not limited to the example including all of the elements described above. The present invention may include another component added to a certain component of the components as stated above, or may include other components instead of some components of the components as stated above. A part of the components as stated above of the present invention may be omitted.

Figure 9A:
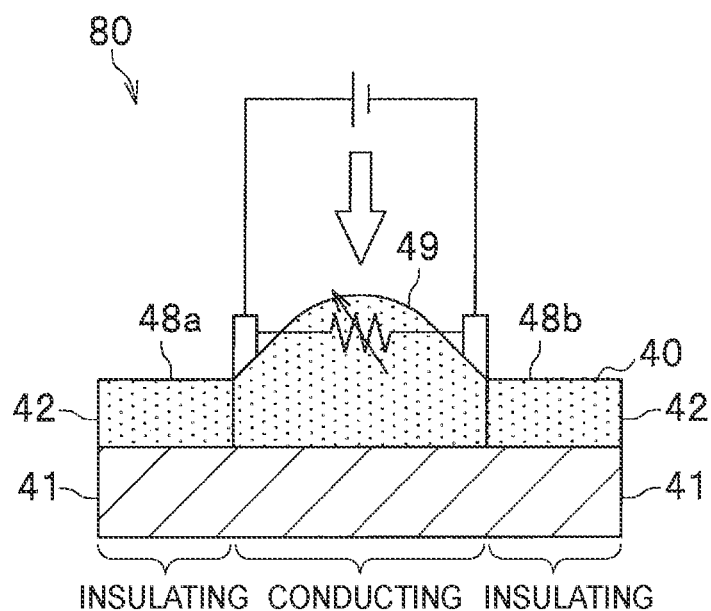
FIG. 9A is drawing (1) that shows a button structure.

In one example, a button structure 80 shown in FIG. 9A may be created using the sheet material 40 of FIG. 1A. FIG. 9A shows the button structure 80 including the sheet material 40.

As shown in FIG. 9A, the button structure 80 has insulating regions 48a and 48b, and a conducting region 49 surrounded with the insulating regions 48a and 48b. As shown in FIG. 1B, the conducting region 49 includes a thermally expandable layer 42 including expanding microcapsule 51 each having a shell 52 having a conducting property and a thermally expandable component (core 53) contained in the shell 52. The conducting region 49 functions as a variable resistance that varies in resistance value when being pressed as indicated with the hollow arrow. Such a button structure 80 may include terminals at the conducting region 49 to apply voltage. Pressing or not of such a button structure 80 may be detected based on a change of the voltage (or current) applied to the terminals.

Figure 9B:
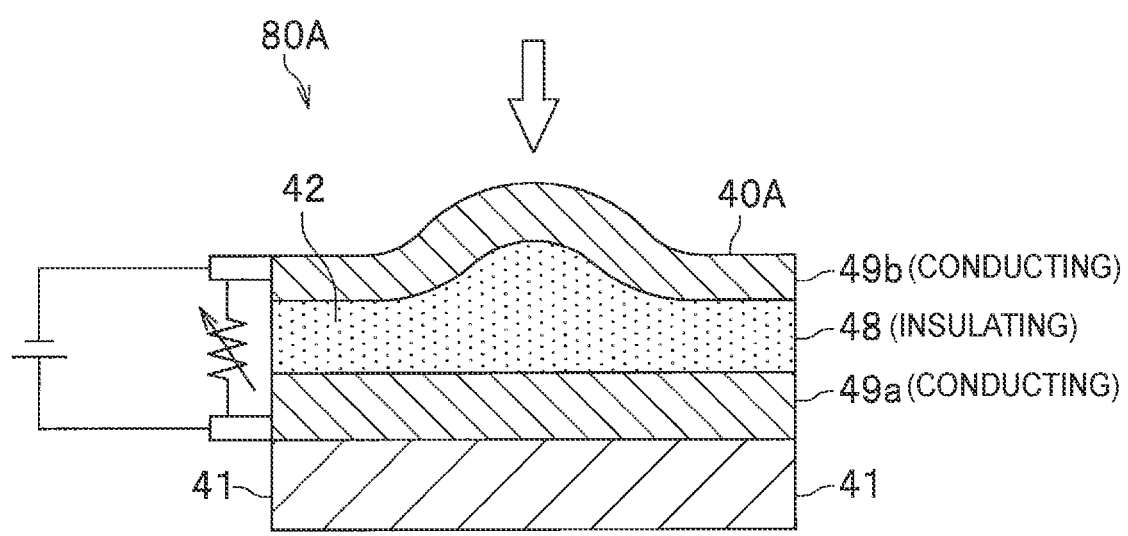
FIG. 9B is drawing (2) that shows a button structure.
Figure 10A:
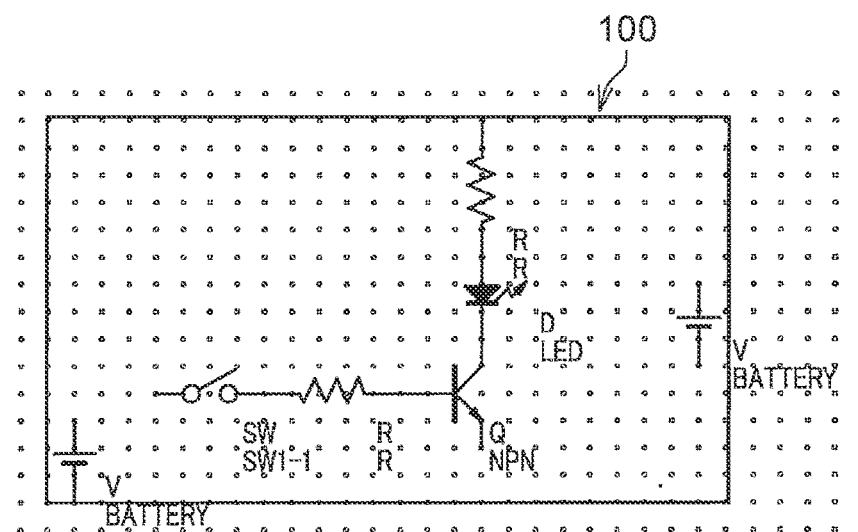
FIG. 10A shows an example of an electronic circuit diagram.
Figure 10B:
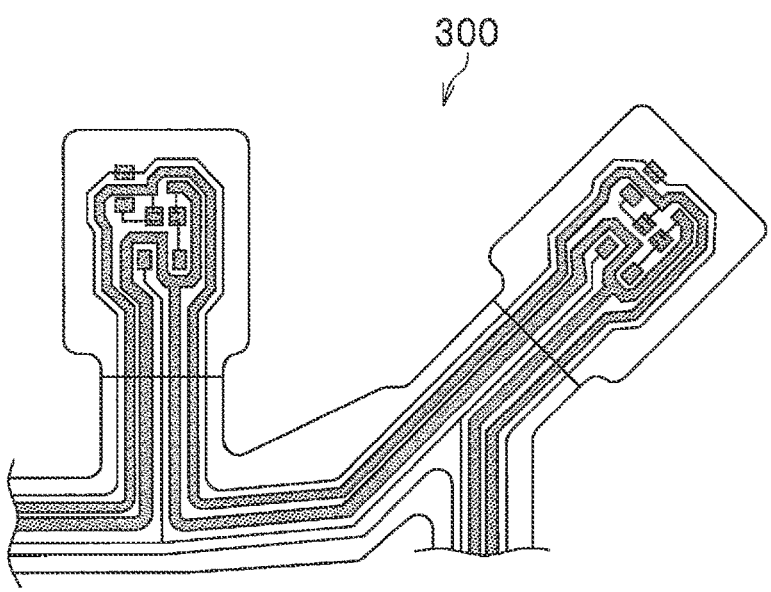
FIG. 10B shows one example of a flexible wiring board.
Figure 10C:
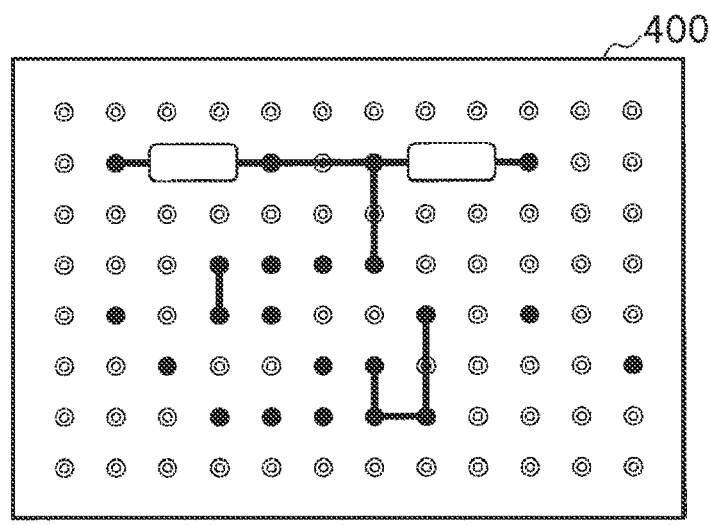
FIG. 10C shows one example of a universal board.

In another example, a button structure 80A may be created as shown in FIG. 9B, which includes a sheet material 40A that is a modified example of the sheet material 40. FIG. 9B shows the button structure 80A including the sheet material 40A that is a modified example of the sheet material 40.

As shown in FIG. 9B, the sheet material 40A includes the laminate on the base layer 41, the laminate including a first conducting layer 49a, a thermally expandable layer 42 and a second conducting layer 49b. The button structure 80A includes such a sheet material 40A. In this button structure 80A, the thermally expandable layer 42 expands partially. Such an expanding region of the thermally expandable layer 42 has a height that keeps an insulating property. That is, the expanding region of the thermally expandable layer 42 is in the state during expansion as shown in FIG. 4B, for example. This means that the expanding region of the thermally expandable layer 42 defines an insulating region when the button structure is not pressed, i.e., the thermally expandable layer 42 is an insulating layer 48.

Such a button structure 80A includes the laminate of the first conducting layer 49a, the insulating layer 48, and the second conducting layer 49b. The insulating layer 48 includes the thermally expandable layer 42 including expanding microcapsule 51 each having a shell 52 having a conducting property and a thermally expandable component (core 53) contained in the shell 52. When being pressed as indicated with the hollow arrow, the conducting shell 52 of each microcapsule 51 in the thermally expandable layer 42 comes in contact with another capsule to have continuity with the other capsule as shown in FIG. 4C, for example. That is, the insulating layer 48 of the button structure 80A functions as a variable resistance that varies in resistance value when being pressed as indicated with the hollow arrow. Such a button structure 80A may include terminals at the first conducting layer 49a and the second conducting layer 49b to apply voltage, for example. Pressing or not of such a button structure 80A may be detected based on a change of the voltage (or current) applied to the terminals.

What is claimed is:

1. A microcapsule comprising a shell including a conducting component; and
a thermally expandable component contained in the shell and having a property of expanding by heating,
the shell deforming due to expansion of the thermally expandable component to come in contact with another capsule and have a conducting state with the other capsule.

2. The microcapsule according to claim 1, wherein the shell includes a resin material having the conducting component mixed therein.

3. The microcapsule according to claim 2, wherein the shell includes an outer layer including a resin material having the conducting component mixed therein, and an inner layer including a resin material not having the conducting component mixed therein.

4. The microcapsule according to claim 1, wherein the shell includes a resin material coated with the conducting component on the surface.

5. A thermally expandable material comprising microcapsules and a binder having an insulating property,
each microcapsule including a shell including a conducting component, and a thermally expandable component contained in the shell and having a property of expanding by heating,
the shell deforming due to expansion of the thermally expandable component to come in contact with another capsule and have a conducting state with the other capsule.

6. A sheet material comprising: a base layer; and
a thermally expandable layer disposed on the base layer, the thermally expandable layer including microcapsules and a binder having an insulating property,
each microcapsule including a shell including a conducting component, and a thermally expandable component contained in the shell and having a property of expanding by heating,
the shell deforming due to expansion of the thermally expandable component to come in contact with another capsule and have continuity with the other capsule.

7. The sheet material according to claim 6, wherein in a not-conducting region where the shells do not have continuity, the microcapsules expand only to a predetermined magnification, and
in a conducting region where the shells have continuity, the microcapsules expand to a predetermined magnification or more.

8. A circuit board comprising: a base layer; and
a thermally expandable layer disposed on the base layer, the thermally expandable layer having a not-expanding region and an expanding region, the not-expanding region defining an insulating region of a circuit, the expanding region defining a conducting region of the circuit,
the thermally expandable layer including microcapsules and a binder having an insulating property,
each microcapsule including a shell including a conducting component, and a thermally expandable component contained in the shell and having a property of expanding by heating,
the shell at the expanding region deforming due to expansion of the thermally expandable component to come in contact with another capsule and have continuity with the other capsule.

9. The circuit board according to claim 8, wherein in the not-expanding region, the thermally expandable layer expands only to a predetermined magnification, and
in the expanding region, the thermally expandable layer expands to a predetermined magnification or more.

10. A method for manufacturing a circuit board, comprising:

a first step of preparing a sheet material including a base layer and a thermally expandable layer disposed on the base layer; and a second step of expanding the sheet material partially so that a not-expanding region of the thermally expandable layer defines an insulating region of a circuit and an expanding region of the thermally expandable layer defines a conducting region of the circuit, the thermally expandable layer including microcapsules and a binder having an insulating property, each microcapsule including a shell including a conducting component, and a thermally expandable component contained in the shell and having a property of expanding by heating, the shell at the expanding region deforming due to expansion of the thermally expandable component to come in contact with another capsule and have continuity with the other capsule.

11. The method for manufacturing the circuit board according to claim 10, wherein in the not-expanding region, the thermally expandable layer expands only to a predetermined magnification, and in the expanding region, the thermally expandable layer expands to a predetermined magnification or more.

12. The method for manufacturing the circuit board according to claim 11, wherein the expanding region has a thickness or an area in accordance with a set resistance value.

13. The method for manufacturing the circuit board according to claim 12, wherein the resistance value increases with a thickness or an area of the expanding region, and the resistance value decreases with a thickness or an area of the expanding region.

14. The method for manufacturing the circuit board according to claim 11, wherein the expanding region has a length in accordance with a set resistance value.

15. The method for manufacturing the circuit board according to claim 14, wherein the resistance value increases with a length of the expanding region, and the resistance value decreases with a length of the expanding region.

16. A computer readable storage medium having stored thereon a program that is executable by a computer, the program making the computer implement the following functions to control a device to create a conversion diagram:

setting a resistance value of a resistance in an electronic circuit diagram data;

forming an image of at least a part of wiring included in the electronic circuit diagram data with photothermal ink; and expanding a thermally expandable layer in a sheet material to make up a circuit board of an electronic circuit to be formed based on the electronic circuit diagram data due to heat from the photothermal ink.

17. The computer readable storage medium according to claim 16, wherein a thickness of a line of the image formed with the photothermal ink is determined in accordance with a resistance value of wiring in the electronic circuit diagram data.

18. The computer readable storage medium according to claim 17, wherein the resistance value increases with a thickness of the line, and the resistance value decreases with a thickness of the line.

19. The computer readable storage medium according to claim 16, wherein a length of a line of the image formed with the photothermal ink is determined in accordance with a resistance value of wiring in the electronic circuit diagram data.

20. The computer readable storage medium according to claim 19, wherein the resistance value increases with a length of the line, and the resistance value decreases with a length of the line.

21. The computer readable storage medium according to claim 16, wherein a density of a line of the image formed with the photothermal ink is determined in accordance with a resistance value of wiring in the electronic circuit diagram data.

22. The computer readable storage medium according to claim 21, wherein the resistance value increases with a density of a line of the image formed with the photothermal ink, and the resistance value decreases with a density of a line of the image formed with the photothermal ink.

23. The computer readable storage medium according to claim 16, further comprising a protective film formed with insulating ink having an insulating property, a region of the protective film being determined based on the electronic circuit diagram data.

* * * * *